(12) United States Patent
Colwell et al.

(10) Patent No.: US 10,729,038 B1
(45) Date of Patent: Jul. 28, 2020

(54) MOBILE DEVICE POINT OF PRESENCE INFRASTRUCTURE

(71) Applicant: HEADSPIN, INC., Mountain View, CA (US)

(72) Inventors: Brien Colwell, Oakland, CA (US); Manish Lachwani, Los Altos, CA (US); Michael Ramirez, San Jose, CA (US)

(73) Assignee: HEADSPIN, INC., Mountain View, CA (US)

( * ) Notice: Subject to any disclaimer, the term of this patent is extended or adjusted under 35 U.S.C. 154(b) by 134 days.

(21) Appl. No.: 15/425,757

(22) Filed: Feb. 6, 2017

Related U.S. Application Data

(60) Provisional application No. 62/303,327, filed on Mar. 3, 2016.

(51) Int. Cl.
| | | |
|---|---|---|
| H05K 7/20 | (2006.01) | |
| G06K 7/00 | (2006.01) | |
| H05K 7/14 | (2006.01) | |
| H05K 7/18 | (2006.01) | |

(52) U.S. Cl.
CPC ....... *H05K 7/20736* (2013.01); *H05K 7/1489* (2013.01); *H05K 7/186* (2013.01); *H05K 7/20172* (2013.01); *H05K 7/20436* (2013.01); *H05K 7/20781* (2013.01); *H05K 7/20854* (2013.01); *H05K 7/20863* (2013.01); *H05K 7/20872* (2013.01)

(58) Field of Classification Search
CPC .. H05K 7/20736; H05K 7/1489; H05K 7/186; H05K 7/20172; H05K 7/20436; H05K 7/20781; H05K 7/20854; H05K 7/20863; H05K 7/20872
See application file for complete search history.

(56) References Cited

U.S. PATENT DOCUMENTS

| | | | | |
|---|---|---|---|---|
| 9,685,803 | B2 * | 6/2017 | Strauser | G06F 1/1632 |
| 9,917,455 | B1 * | 3/2018 | Shipman | H02J 7/0044 |
| 2006/0070384 | A1 * | 4/2006 | Ertel | G01T 1/2018 62/3.3 |
| 2007/0258216 | A1 * | 11/2007 | McBain | H05K 7/20154 361/707 |
| 2009/0295328 | A1 * | 12/2009 | Griffin, Jr. | H02J 7/0027 320/115 |
| 2010/0078470 | A1 * | 4/2010 | DalPorto | G11B 27/002 235/375 |
| 2011/0057603 | A1 * | 3/2011 | Marty | H02J 7/0069 320/106 |

(Continued)

*Primary Examiner* — James Wu
*Assistant Examiner* — Michael A Matey
(74) *Attorney, Agent, or Firm* — Lindauer Law, PLLC

(57) ABSTRACT

Mobile devices executing applications utilize data services worldwide. An application executing on these mobile devices may be tested using proxy access devices (PADs) located at various points-of-presence (POPs) at different geolocations. A PAD retainer device is used to maintain a plurality of PADs in a high density arrangement while still permitting adequate cooling, wireless connectivity, and physical connectivity to a proxy host device. In one implementation, the PAD retainer device is configured to maintain a predefined physical configuration of the PADs mounted therein, while hot spots of the PADs are exposed to the ambient atmosphere to facilitate heat dissipation.

19 Claims, 9 Drawing Sheets

(56) References Cited

U.S. PATENT DOCUMENTS

| | | | |
|---|---|---|---|
| 2012/0098493 A1* | 4/2012 | Budike | H02J 7/0044 320/111 |
| 2012/0243170 A1* | 9/2012 | Frink | G06F 1/187 361/679.34 |
| 2012/0327327 A1* | 12/2012 | Joo | H05K 1/189 349/58 |
| 2014/0132201 A1* | 5/2014 | Tsang | H02J 50/30 320/107 |
| 2014/0321058 A1* | 10/2014 | Fujieda | G06F 1/203 361/700 |
| 2015/0143496 A1* | 5/2015 | Thomas | G06F 21/35 726/7 |
| 2016/0091938 A1* | 3/2016 | Edwards | G06F 1/3231 700/300 |
| 2016/0183108 A1* | 6/2016 | Mehrgardt | F25B 21/02 455/456.1 |
| 2016/0360644 A1* | 12/2016 | Bains | G06F 1/203 |

\* cited by examiner

MOBILE DEVICE POINT OF PRESENCE INFRASTRUCTURE

PRIORITY

This application claims priority to U.S. Provisional Patent Application No. 62/303,327 filed on Mar. 3, 2016, entitled "Mobile Device Point of Presence Infrastructure", which is also incorporated by reference herein in its entirety.

INCORPORATION BY REFERENCE

U.S. Non-Provisional patent application Ser. No. 14/850,798 filed Sep. 10, 2015, and titled "System for Application Test" is hereby incorporated by reference in its entirety.

U.S. Non-Provisional patent application Ser. No. 14/976,480 filed Dec. 21, 2015, and titled "System for Network Characteristic Assessment" is hereby incorporated by reference in its entirety.

U.S. Provisional Patent Application No. 62/298,820 filed Feb. 23, 2016, and titled "Adaptive Application Behavior Based on Assessed Network Characteristics" is hereby incorporated by reference in its entirety.

BACKGROUND

Mobile devices executing applications that utilize networks during operation to transfer data may experience failures or otherwise produce adverse user experiences as a result of network conditions. Gathering information at the mobile device about characteristics of the network may be useful to prevent or mitigate the impacts of failures.

BRIEF DESCRIPTION OF FIGURES

The detailed description is set forth with reference to the accompanying figures. In the figures, the left-most digit(s) of a reference number identifies the figure in which the reference number first appears. The use of the same reference numbers in different figures indicates similar or identical items or features.

Figure 1:
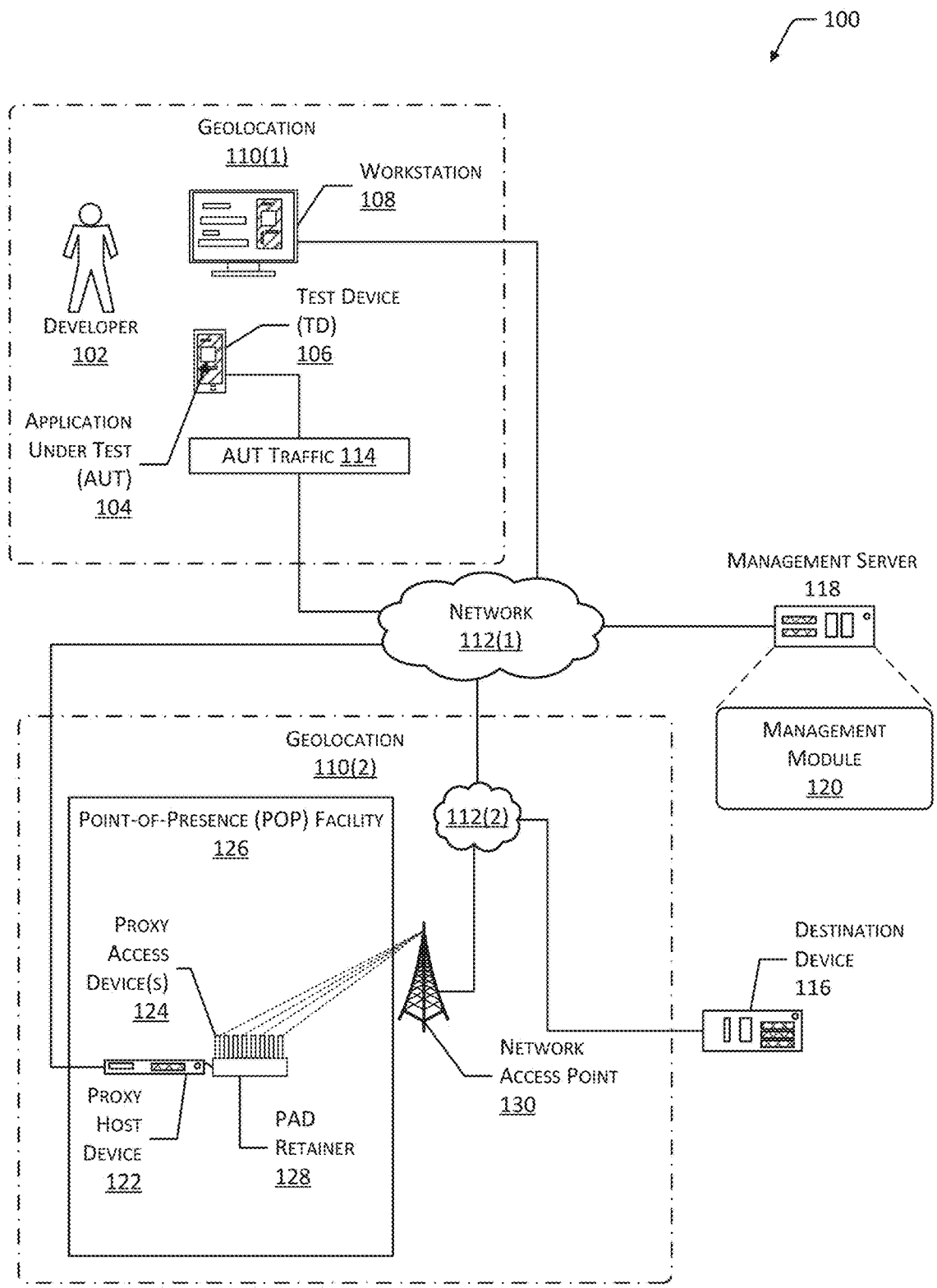
FIG. 1 depicts a system for testing mobile devices using an array of proxy access devices (PADs) maintained in a PAD retainer, according to one implementation.

While implementations are described in this disclosure by way of example, those skilled in the art will recognize that the implementations are not limited to the examples or figures described. It should be understood that the figures and detailed description thereto are not intended to limit implementations to the particular form disclosed but, on the contrary, the intention is to cover all modifications, equivalents, and alternatives falling within the spirit and scope as defined by the appended claims. The figures are not necessarily to scale nor proportionate to one another. Furthermore, the items depicted within the figures are not necessarily of representative proportion to one another. For example, some items or features thereon may be exaggerated in size for purposes of illustration.

The headings used in this disclosure are for organizational purposes only and are not meant to be used to limit the scope of the description or the claims. As used throughout this application, the word "may" is used in a permissive sense (i.e., meaning having the potential to) rather than the mandatory sense (i.e., meaning must). Similarly, the words "include", "including", and "includes" mean "including, but not limited to".

DETAILED DESCRIPTION

Mobile devices may execute an application to provide various functions. These mobile devices may include, but are not limited to, smartphones, laptops, tablet computers, embedded devices, wearable computing devices, appliances, automobiles, aircraft, and so forth. Functions provided by the application may involve retrieval of data, presentation of that data to a user, processing of data, and so forth.

Some applications may communicate with one or more external devices, such as a server, using a network. For example, a navigation application may use the network to send location information to an application server that is indicative of a position of a mobile device and receive map data to present on a display of the mobile device. Problems with this communication may result in the application failing to perform the desired function, error messages, improper operation, and so forth. Continuing the example above, a long latency or delay in receiving the map data may cause the application on the mobile device to present an error to the user. These problems may result in an adverse user experience. For example, the user may discontinue using the application because of these problems and instead use another application.

Some problems that the application may encounter while using the network may not be immediately perceived by the user. For example, the application may drain the battery of the mobile device more quickly by resending data due to communication problems with the network.

The network used by the computing device to access the external device may include a wireless wide area network (WWAN), such as a wireless cellular data network (WCDN). For example, the mobile device may comprise a smartphone that accesses a WCDN provided by a telecommunication company. By using the WCDN, the smartphone is able to send and receive data with other devices, such as those accessible on the Internet. In other implementations, a local network such as a wireless local area network (WLAN) may be used to send and receive data with other devices. For example, the mobile device may access a Wi-Fi hotspot in a common area such as an airport, train station, aircraft, train, and so forth.

Performance of the network used by the computing device executing the application may be variable due to many factors. These factors may include the geographic location (geolocation) of where the computing device is located while communicating with the network, the network access point in use, congestion at the network access point, congestion at the interconnect that connects the WCDN or WLAN to another network such as the Internet, capability of the network access point, and so forth. For example, during a morning commute, many users may be streaming video content to their mobile devices, resulting in overall network congestion. In another example, the telecommunication company may have some network access points that support 3G data transmission and are relatively more congested while other network access points are able to support 4G data transmission and are relatively less congested.

Network characteristics may include information associated with the transfer of data using the network. For example, the network characteristics may include, but are not limited to, bandwidth, latency, number of packets sent, packet loss, transmit power, received signal strength, jitter, and so forth. The network characteristics for a particular connection between a network access point and a communication interface of a computing device may be available locally, but may be difficult or impossible to provide to a developer or other entity associated with maintaining the application or the computing device.

The network characteristics, or information based on the network characteristics, may be very useful to a user of the computing device, developers of the application, or other entities. For example, detailed network characteristics may provide a developer with insight that particular areas in a particular city have poor cellular or Wi-Fi data coverage. Using this information, the developer may take measures to improve the user experience, such as modifying operation of the application, working with the telecommunication company to improve coverage, and so forth.

To facilitate testing of applications, including the acquisition of real-world network characteristics, a point-of-presence (POP) facility may be located at a particular geolocation. The POP facility may include a proxy host device that is connected to a plurality of proxy access devices (PADs). A developer may execute an application under test on a test device at a first geolocation. For example, the test device may comprise the developer's smartphone. Traffic from the application under test may be directed through a first network to a POP facility at a second geolocation. At the POP facility, a PAD is used to connect to a second network, such as a WCDN of a particular carrier using a particular communication mode. The second network by way of the PAD is then accessible by the test device. During operation, the test device may exchange traffic with a destination device using the PAD at the second geolocation. Network characteristics associated with this traffic may be obtained and used to generate data. The system allows the developer to test the application as if it were operating at various different geolocations without ever leaving their office.

The system may be designed to support numerous testing sessions at a POP facility by maintaining a pool of available PADs. During an individual session, one of the available PADs may be used. The PADs may comprise cellphones, smartphones, tablets, or other devices. The PADs may or may not be the same make, model, manufacture, and so forth, of the test device. For example, the test device may comprise a high-end tablet device while the PAD may comprise an inexpensive smartphone.

A POP facility may include an array of many PADs to satisfy demand. For example, the POP facility may include any number of PADs, such as 64 or more PADs. A PAD retainer may be used to maintain the plurality of PADs in a high density physical configuration that facilitates cooling of the individual PADs, maintenance, and so forth. Described in this disclosure are various implementations of the PAD retainer.

By using the systems and devices described herein, POP facilities for testing applications for mobile devices may be quickly and easily deployed and maintained. Large numbers of PADs may be arranged within a relatively small volume, improving the availability of PADs for testing while also more efficiently utilizing volume within the POP facility. By using output data generated from the testing, network access problems may be identified, the user experience of the application may be improved, power consumption of mobile devices may be reduced, and so forth.

FIG. 1 depicts a system 100 for testing mobile devices, according to one implementation. A developer 102 may be an individual, group of individuals, or entity that is tasked with creating a new application, maintaining an existing application, re-factoring an existing application, and so forth. The developer 102 may be working on an application under test (AUT) 104. The AUT 104 may be executed on a computing device such as a test device (TD) 106, a workstation 108, and so forth. For example, the TD 106 may comprise a mobile device such as a smartphone, tablet computer, wearable computing device, and so forth. The workstation 108 may comprise a laptop, desktop computer, and so forth.

The AUT 104 may be an application that is at any stage in a development or maintenance lifecycle. For example, the AUT 104 may comprise an alpha (or prerelease) version of software or may comprise a previously released production version that is undergoing further testing.

The workstation 108 may include an integrated development environment (IDE) to facilitate the creation and editing of program code, debugging, compiling, and so forth. In some implementations, the workstation 108 may comprise an emulator or simulator that is designed to execute the AUT 104 as if it were executing on another piece of hardware, under a different operating system, and so forth.

The developer 102 may test the AUT 104 to determine problems associated with use of the AUT 104. Once those problems have been determined, they may be mitigated. For example, the developer 102 may change the program code of the AUT 104 to remedy the problem. The developer 102 may use the system described below to determine at least some of the problems associated with operation of the AUT 104.

One or more of the developer 102, the TD 106, or the workstation 108 may be located at a first geolocation 110(1). The geolocation 110 comprises a geographic location, such as a particular room, building, city, state, country, and so forth. For example, the geolocation 110 may be specified by a set of coordinates with regard to latitude and longitude on the surface of the Earth.

One or more of the TD 106 or the workstation 108 may be connected to a first network 112(1). The first network 112(1) may, in turn, be connected to or be part of a larger network. For example, the first network 112(1) may comprise the Internet. The connection used by the TD 106 or the workstation 108 may include, but is not limited to, a wired Ethernet connection, a wireless local area network (WLAN) connection such as Wi-Fi, and so forth. For example, the first geolocation 110(1) may comprise an office where the developer 102 is working. The TD 106 may connect to a local Wi-Fi access point that is connected via Ethernet cable to a router. The router, in turn, is connected to a cable modem that provides connectivity to the Internet.

During operation, the AUT 104 may rely on access to an external resource, such as a destination device 116. For example, the AUT 104 may comprise a social networking application that sends data generated by a user and retrieves information from a server. As a result, in some implementations, the AUT 104 may require access to the destination device 116 for normal operation.

A single destination device 116 is depicted for ease of illustration and not necessarily as a limitation. For example, the AUT 104 may exchange AUT traffic 114 with many different destination devices 116 during operation.

The AUT 104 may generate AUT traffic 114 that is exchanged with the destination device 116 during operation. Traditionally, the AUT traffic 114 generated by the TD 106 or the workstation 108 at the first geolocation 110(1) would be sent to the first network 112(1) and on to the destination device 116. However, this traditional situation limits the ability to generate test data to the first geolocation 110(1).

To provide the functionality described herein, the developer 102 may incorporate a software development kit (SDK) into the AUT 104. For example, at compile time, the SDK may be included into the compiled AUT 104. In other implementations, techniques other than an SDK may be used to provide the functionality described herein. For example, lines of computer code that provide the functionality of at least a portion of the SDK may be incorporated into the code base of the AUT 104.

The SDK is configured to provide a user interface to the developer 102 that allows for the redirection of the AUT traffic 114. The SDK may comprise instructions to establish communication with the management server 118. For example, the SDK may add a user interface that allows the developer 102 to interact with the management module 120.

The management server 118 utilizes the management module 120 to coordinate the activities of one or more proxy host devices 122 or proxy access devices (PADs) 124. The proxy host device 122 connects to the first network 112(1) and also to one or more PADs 124. Any number of PADs 124 may be tethered to the proxy host device 122. For example, the proxy host device 122 may comprise a server to which 64 PADs 124 are tethered by way of universal serial bus (USB) cables.

The proxy host device 122 and the attached PADs 124 may be located at a point-of-presence (POP) facility 126 present at a second geolocation 110(2) that is different from the first geolocation 110(1) of the TD 106. For example, the POP facility 126 may be located within a datacenter, structure, vehicle, or portable system present at the second geolocation 110(2) in another city, state, country, and so forth.

The POP facility 126 may maintain one or more proxy host devices 122, along with a plurality of PADs 124. A PAD retainer 128 may be used to maintain the plurality of PADs in a high density physical configuration that facilitates operation. For example, the PAD retainer 128 may be configured to provide physical support and separation between individual PADs 124 while providing sufficient clearance for cooling, emission of radio signals, to allow for viewing at least a portion of the display device or other output device of the PAD 124 for maintenance purposes, to provide routing for cabling associated with tethering the PAD 124 to the proxy host device 122, to facilitate identification of a particular PAD 124 for maintenance purposes, and so forth. The PAD retainer 128 is described in more detail below with regard to FIGS. 2-9.

The PADs 124, in turn, are able to connect to a network access point 130. The network access point 130 provides connectivity to a second network 112(2). For example, the PADs 124 may comprise commodity cellphones, the network access points 130 may comprise cell phone towers, and the second network 112(2) may comprise a WWAN, such as a wireless cellular data network (WCDN). In other implementations, the second network 112(2) may comprise a network that includes a wireless local area network (WLAN). For example, the network access point 130 may comprise a Wi-Fi hotspot. The second network 112(2) may in turn be connected to the first network 112(1). For example, the WCDN operated by a telecommunication company may interconnect or have a peering agreement with an Internet backbone provider. As a result, a user of the second network 112(2) may be able to access resources on the first network 112(1), and vice versa.

Returning to the AUT 104, as part of the testing process, the developer 102 may use the user interface to access the management module 120 of the management server 118. From the user interface, the developer 102 may select one or more of a particular geolocation 110 or virtual device to use during testing. The management module 120 may maintain information about the PADs 124 associated with those virtual devices, such as geolocation 110, availability, cost, type of PAD 124, and so forth.

The management module 120 may coordinate establishment of a session between the AUT 104 and a virtual device. The virtual device may be selected by the developer 102. The virtual device in turn is associated with one or more the PADs 124. For example, based on the selection of the virtual device by the developer 102, the management module 120 may determine the proxy host device 122 and retrieve information such as digital certificates, cryptographic credentials, network address, and so forth. In one implementation, the management module 120 may communicate with the proxy host device 122 to prepare the proxy host device 122 for communication with the AUT 104. In another implementation, the management module 120 may provide configuration data to the AUT 104, which in turn connects to the proxy host device 122 and sends the configuration data. In other implementations, other connection methodologies may be utilized.

During testing, the AUT traffic 114 may be routed through the first network 112(1) to the proxy host device 122, through the PAD 124 to the second network 112(2), and ultimately arrives at the destination device 116. The AUT traffic 114 may include outbound application traffic and inbound application traffic. The output application traffic may comprise data that is sent from the AUT 104 to the destination device 116. The inbound application traffic may comprise data that is sent from the destination device 116 to the AUT 104. During operation, the AUT 104 directs the outbound application traffic to the proxy host device 122 associated with the selected PAD 124. The proxy host device 122 in turn transfers the outbound application traffic to the selected PAD 124, which then sends the outbound application traffic to the second network 112(2). The second network 112(2) may then send the outbound application traffic to the destination device 116. Inbound application traffic from the destination device 116 may follow the reverse path or another path on return.

The management server 118 may collect log data associated with operation of the system. The log data may include proxy session data. The proxy host device 122 may be configured to generate the proxy session data. The proxy session data may include "breadcrumb" data, information associated with operation of the PAD 124, packet capture of data transferred by the proxy host device 122, and so forth. The breadcrumb data may include, for a particular instant or interval of time, one or more of: a current page on a website, type of network that the PAD 124 is connected to, quantity of data received, quantity of data transmitted, latency to the destination device 116, data throughput, received signal strength, transmit power, cost associated with data transfer on the second network 112(2), and so forth. For example, the breadcrumb data may indicate that the PAD 124 was connected at timestamp 201508172312030092 to webpage http://www.example.com/main.html using a 3G network connection with a received signal strength of 14 dBm, a transmit power of 7 dBm, data throughput of 400 Kbps, and so forth. The proxy session data is thus the product of the AUT 104 operating on a real-world second network 112(2) at a desired geolocation 110. The resulting proxy session data is representative of the real world, including the complexities and nuances associated therewith.

The management server 118 may obtain the proxy session data. For example, the proxy host device 122 may stream the proxy session data to the management server 118 during the test session. In another example, the management server 118 may poll the proxy host devices 122.

An analysis module may be configured to process the proxy session data and generate report data. For example, the analysis module may parse the proxy session data to determine a first timestamp of when a first request was sent and a second timestamp of when a first response to the first request was received. Based on the first timestamp and second timestamp, a latency to fulfill the request to the second network 112(2) may be determined.

In some implementations, the report data may specify one or more optimizations of possible modifications to the AUT 104. For example, the report data may specify a particular portion of the AUT 104 that is generating requests with latencies over a threshold value.

During testing, the developer 102 may acquire the proxy session data. For example, the developer 102 may use the TD 106 to execute the AUT 104 and test different geolocations 110.

Figure 2:
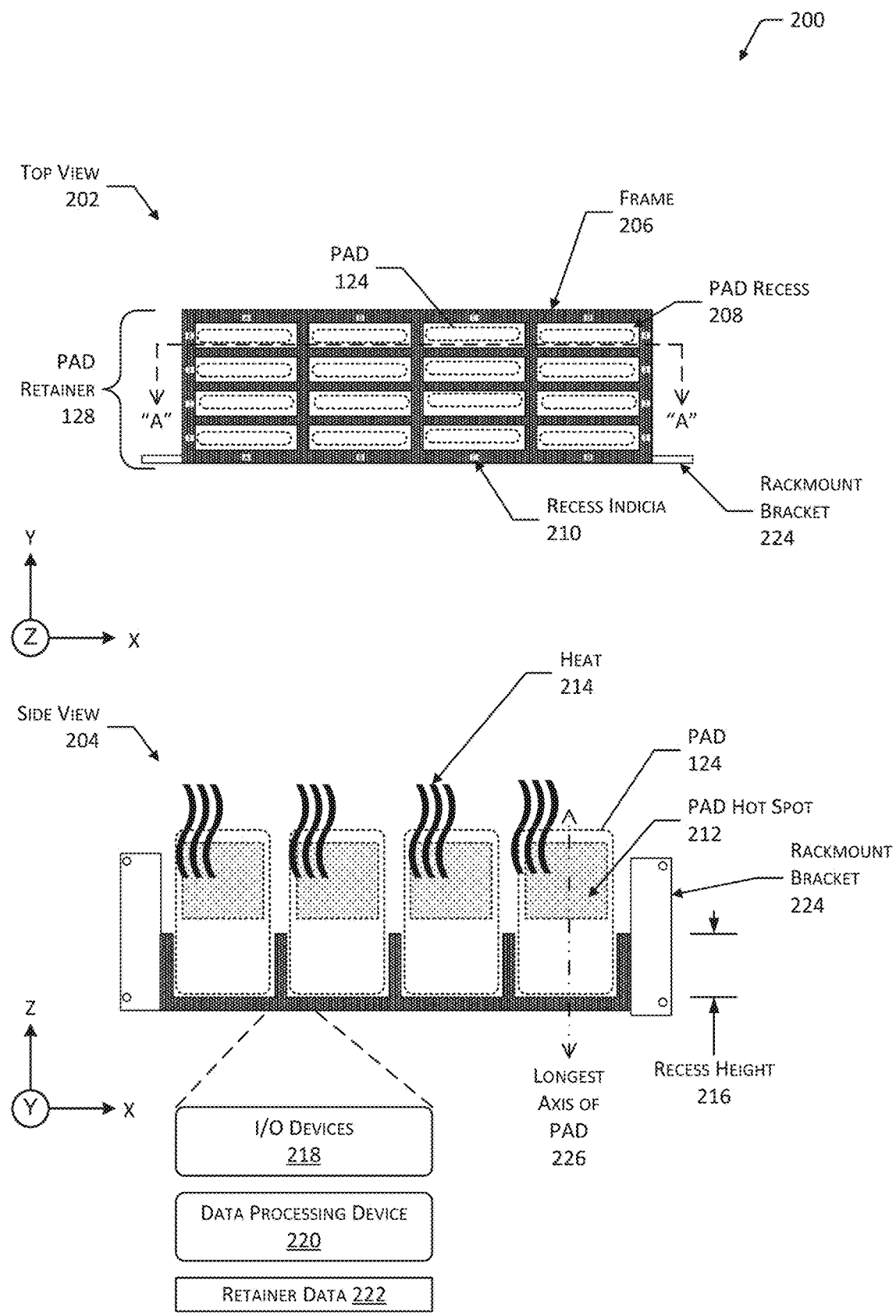
FIG. 2 depicts a first implementation of a PAD retainer.

FIG. 2 depicts views of a first implementation 200 of a PAD retainer 128. A top view 202 and a side view 204 along line A-A of the PAD retainer 128 are depicted. For clarity of illustration and not as a limitation, in this and the following figures, tether cables to connect the PAD 124 to the proxy host device 122 may be omitted.

The PAD retainer 128 comprises a frame 206 or a body. The frame 206 may comprise a single unitary piece or may comprise a plurality of pieces. For example, the frame 206 may comprise a base, walls, partitions, and so forth. Different portions of the frame 206 may comprise different materials. For example, the walls of the frame 206 may comprise a material that is substantially transparent to radio frequencies associated with operation of one or more radios within the PADs 124. Substantially transparent may include materials that produce some attenuation to the passage of signals in the radio frequencies associated with operation. For example, the material may be deemed to be substantially transparent if the attenuation is less than 3 dB.

The material of the frame 206 may comprise one or more of a plastic, ceramic, wood, paper, glass, composite material, and so forth. For example, at least a portion of the frame 206 may comprise an expanded polystyrene (EPS) material. In other examples, at least a portion of the frame 206 may comprise cardboard, corrugated plastic sheets, and so forth. In some implementations, the material may be infused, mixed, coded, or otherwise treated with a fire retardant or combustion inhibitor.

The frame 206 may itself be solid or porous to light, air, fluid, and so forth. In one implementation, the frame 206 may comprise a latticework structure that provides physical support while allowing the passage of ambient air between the support members of the latticework. In other implementations, the frame 206 may comprise a foam having pores through which ambient air may move, perforated plastic, and so forth. In another implementation, the frame 206 may comprise a non-porous structure, such as an unbroken sheet of EPS.

In some implementations, the material may comprise an electrically conductive material. For example, the material may comprise a steel mesh that has one or more openings. The size of the openings may be such that they permit passage of the wavelength of radio frequencies associated with operation of the PADs 124. For example, the openings may have a width greater than a wavelength of the radio frequency.

While the frame 206 is depicted here having an overall shape of a rectangle, the frame 206 may have a perimeter that describes other polygons. For example, the frame 206 may have an overall shape of a square, triangle, hexagon, circle, and so forth. In some implementations, the overall shape of the frame 206 may be configured to form part of a space filling tessellation or tiling to facilitate a high packing density.

The frame 206 is arranged to provide one or more PAD recesses 208. As illustrated in this depiction, PAD recesses 208 are arranged in a generally regular pattern of rows and columns. Each PAD recess 208 comprises a width, length, and height suitable to accept at least a portion of the PAD 124, such as a first end. In some implementations, the PAD recess 208 may be larger than the external dimensions of the PAD 124. For example, the PAD recess 208 may provide 2 to 10 millimeters (mm) of clearance between an outer case of the PAD 124 and the walls of the PAD recess 208. In other implementations, the PAD recess 208 may be slightly smaller than the external dimensions of the PAD 124. The material of the frame 206 may be slightly compressible, allowing the PAD recess 208 to snugly fit and engage the PAD 124 to minimize motion therein. For example, the walls of the PAD recess 208 may comprise a foam that is at least partially compressible and that returns to substantially the same shape upon removal of the compression. The PAD 124 may be inserted at least partially into the PAD recess 208 where the foam slightly compresses and exerts a pressure against two or more of the sides of the PAD 124.

In some implementations, the PAD retainer 128 may include or incorporate wiring, connectors, and so forth, suitable to provide the connection between the proxy host device 122 and the PADs 124 stowed therein. For example, the PAD recess 208 may include a connector that has a first end configured to couple to the PAD 124 and a second end configured to couple to another device, such as the proxy host device 122. When the PAD 124 is coupled to the connector, communication may be established between the PAD 124 and an external device such as the proxy host device 122. In some implementations, the connectors may be rigidly affixed within the PAD recess 208, or may have a flexible or wired end.

One or more recess indicia 210 may be associated with the PAD retainer 128. The recess indicia 210 provide an indication that may be used to locate a particular PAD recess 208 within the PAD retainer 128. The recess indicia 210 may facilitate maintenance of the POP facility 126 by allowing an operator to quickly access a particular PAD 124. For example, the recess indicia 210 when combined with a PAD retainer indicia (not shown) may be used by a human or robotic attendant to find and replace a PAD 124 that has malfunctioned.

The recess indicia 210 may comprise one or more human-readable symbols configured to identify individual ones of the PAD recesses 208 within the frame 206. For example, the recess indicia 210 may comprise Arabic numbers indicating particular rows and English letters indicating particular columns, or associated with each of the one or more of the individual PAD recesses 208. The recess indicia 210 may comprise machine-readable symbology. For example, the recess indicia 210 may comprise a two-dimensional barcode. Barcodes may be associated with rows, columns, or one or more of the individual PAD recesses 208. The machine-readable symbology may be suitable for detection and readout by devices such as cameras.

Each of the PADs 124 may exhibit one or more PAD hot spots 212. The PAD hot spots 212 comprise areas or regions of the PAD 124 in which heat 214 is radiated during operation. During use of the PAD 124, electrical power used to operate the components of the PAD 124 may be dissipated at least in part as heat 214. This heat 214 is emitted from the PAD 124. Due to design considerations of the particular PAD 124, the heat 214 may be dissipated at the PAD hot spots 212. For example, the PAD hot spot 212 may correspond to a heat sink of the PAD 124.

The PAD recesses 208 within the frame 206 are configured with a recess height 216 that allows for the PAD hot spots 212 to be substantially exposed to the ambient environment. In one implementation, a recess height 216 of each PAD recess 208 is less than or equal to a distance from a first end of a PAD 124 to a first edge of an area designated as a PAD hot spot 212 on the PAD 124. As a result, at least a portion of the area designated as the PAD hot spot 212 is exposed to ambient air during operation.

In some implementations, the recess height 216 of each PAD recess 208 may be greater than or equal to a distance from a first end of the PAD 124 to an edge of an area designated as a PAD hot spot 212 on the PAD 124, wherein the edge is distal from the first end and proximate to a second end of the PAD 124.

In some implementations, some of the PAD recesses 208 within the PAD retainer 128 may have different recess heights 216. For example, a first PAD recess 208(1) may have a first recess height 216(1) that is less than a second recess height 216(2) in a second PAD recess 208(2). The different recess heights 216 may be configured to accommodate PADs 124 with different placement of PAD hot spots 212, of differing size, and so forth. In some implementations, removable spacers may be inserted into or removed from the PAD recesses 208 to change the recess height 216.

In some implementations, the frame 206 may comprise a reconfigurable structure. The frame 206 may comprise blocks of material that may be added or removed to vary one or more of the size or shape of the PAD recess 208. For example, the frame 206 may comprise blocks that adhere to one another or a portion of the frame 206 using a hook and loop fastener, mechanical engagement feature such as slots or pegs, and so forth.

The exposure of the PAD hot spot 212 that results from the recess height 216 allows the heat 214 from the PADs 124 to be dissipated in the surrounding atmosphere. By dissipating the heat 214, the PADs 124 are sufficiently cooled and overheating as well as subsequent shutdown or damage of the PADs 124 is prevented.

In other implementations, the recess height 216 may be such that the height of the frame 206 extends above at least a portion of the PAD hot spot 212. For example, the PAD hot spot 212 may be somewhat ambiguously defined, changing with the operation of the PAD 124, varying with the placement of the PAD 124 within the PAD recess 208, and so forth. However, in this implementation the recess height 216 is sufficient to allow for dissipation of the heat 214 from the PAD 124, allowing for operation of the PAD 124 without adverse effects.

In some implementations, the PAD retainer 128 may include one or more devices. These devices may include one or more input/output (I/O) devices 218, one or more data processing devices 220, and so forth. The I/O devices 218 may include sensors, displays, speakers, and so forth. For example, the sensors may include one or more of: a thermocouple, a photosensor, a camera, a near field communication (NFC) sensor, a radio frequency identification device (RFID), an accelerometer, proximity sensor, switches, and so forth.

The data processing device 220 may include at least one processor executing instructions to generate retainer data 222 based at least in part on the output from the one or more sensors. The retainer data 222 may be transferred to the proxy host device 122 by way of one or more communication interfaces.

In some implementations, the data processing device 220 may be used to generate output. The output devices may include light emitting diodes, liquid crystal displays, piezoelectric speakers, and so forth. For example, the data processing device 220 may activate one or more light-emitting diodes to emit light, indicating the location of a particular PAD recess 208. An operator of the POP facility 126 may use the light to more easily and accurately find the particular PAD recess 208.

The thermocouple may be used to provide retainer data 222 indicative of a temperature at one or more of the PAD recesses 208 or other locations at or near the PAD retainer 128. For example, a thermocouple or other temperature sensing device may be arranged within one or more of the PAD recesses 208 to provide external verification of the temperature of a particular PAD 124.

The photosensor may be used to detect light emitted from an output device of the PAD 124, such as a display screen, light-emitting diode, and so forth. For example, the photosensor may provide retainer data 222 that is useful to determine if a display screen of the PAD 124 has been activated to present a predominantly white image. This retainer data 222 may be used to verify operation of the display device on the PAD 124.

The camera may be used to acquire images of at least a portion of the frame 206 and the PAD recesses 208 and any PADs 124 stowed therein. For example, the camera may be used to take a picture of a display device of one or more of the PADs 124 to provide verification of operation. In another example, the camera may be used to take a picture that is used for inventorying or otherwise confirming the presence of a PAD 124 at a particular PAD recess 208. In some implementations, a picture from the camera may be used to generate inventory data. For example, each PAD 124 may include a machine-readable symbology such as the barcode that, when combined with the recess indicia 210 may be used to associate a particular PAD 124 with a particular PAD recess 208.

One or more of the NFC or RFID sensors may be used to determine the presence of a PAD 124, as well as information about that PAD 124. For example, the NFC or RFID sensors may be used to generate inventory of identifiers that are indicative of particular PADs 124 that are present at the PAD retainer 128. Data indicative of the output from these sensors may be provided as retainer data 222 to the proxy host device 122 or other devices such as the management server 118. Using this retainer data 222, an inventory of the PADs 124 present at the PAD retainer 128 may be determined.

The accelerometer may provide retainer data 222 that is indicative of motion of one or more of a PAD 124 stowed within the frame 206 or the frame 206 itself. One or more accelerometers may be positioned at various points within the frame 206. Activation of a haptic output device of one of the PADs 124 may generate a vibration that is detectable by one or more of the accelerometers. For example, a particular PAD 124 may be commanded by the proxy host device 122 to generate a haptic output using an eccentric mass rotated by an electric motor within the particular PAD 124. The retainer data 222 obtained from the accelerometer may be used to verify this operation.

Other sensors such as a proximity sensor, switches, and so forth, may also be used to generate retainer data 222. For example, a proximity sensor may be used to determine if a PAD 124 is present within a particular PAD recess 208. The proximity sensor may be a contact proximity sensor or a noncontact proximity sensor.

By using the retainer data 222, one or more of proxy host device 122, the management server 118, or the developer 102 may better able to administer and manage the PADs 124 in the POP facility 126, determine the physical impacts of testing on the PADs 124, and so forth.

One or more brackets may be affixed to, integral with, or supportive of the frame 206. In this illustration, rackmount brackets 224 are depicted on either side of the PAD retainer 128. The rackmount brackets 224 may comprise one or more mechanical engagement features suitable for attachment to a standardized equipment rack. For example, the rackmount bracket 224 may be compliant with at least a portion of the EIA-310 specification as promulgated by the Electronic Industries Alliance (EIA). Mechanical engagement features may include, but are not limited to, threaded holes, bolts tabs, latches, pegs, rails, and so forth.

In another implementation, the frame 206 may be supported at least in part by a computing device, such as the proxy host device 122. For example, the frame 206 may rest atop or be mounted to a surface of the proxy host device 122. The proxy host device 122 may itself have dimensions compliant with a standardized equipment rack specification.

In yet another implementation, the rackmount brackets 224 may be omitted and the frame 206 may be supported by a shelf or drawer. For example, a shelf that is compliant with at least a portion of EIA-310 may be mounted to a rack. The frame 206 may then rest upon that shelf.

In some implementations, PADs 124 may be oriented upside down within the PAD recesses 208. For example, a top or upper portion of the PAD 124 may come in contact with the bottom of the PAD recess 208 when stowed within the PAD retainer 128. For example, the PAD 124 may be oriented with a longest axis of the PAD 226 oriented at an angle of less than 70° from a vertical line extending perpendicular to a plane of a base of the frame 206.

An enclosure (not shown) may also be used. In some implementations, a portion of the frame 206 may be used to form the enclosure. For example, the portion of the frame 206 along the perimeter may be extended in height relative to interior partitions that form the PAD recesses 208.

By utilizing the PAD retainer 128 described above, a POP facility 126 may be operated that maintains a relatively large number of PADs 124 in an organized configuration that allows for their operation without damage.

Figure 3:
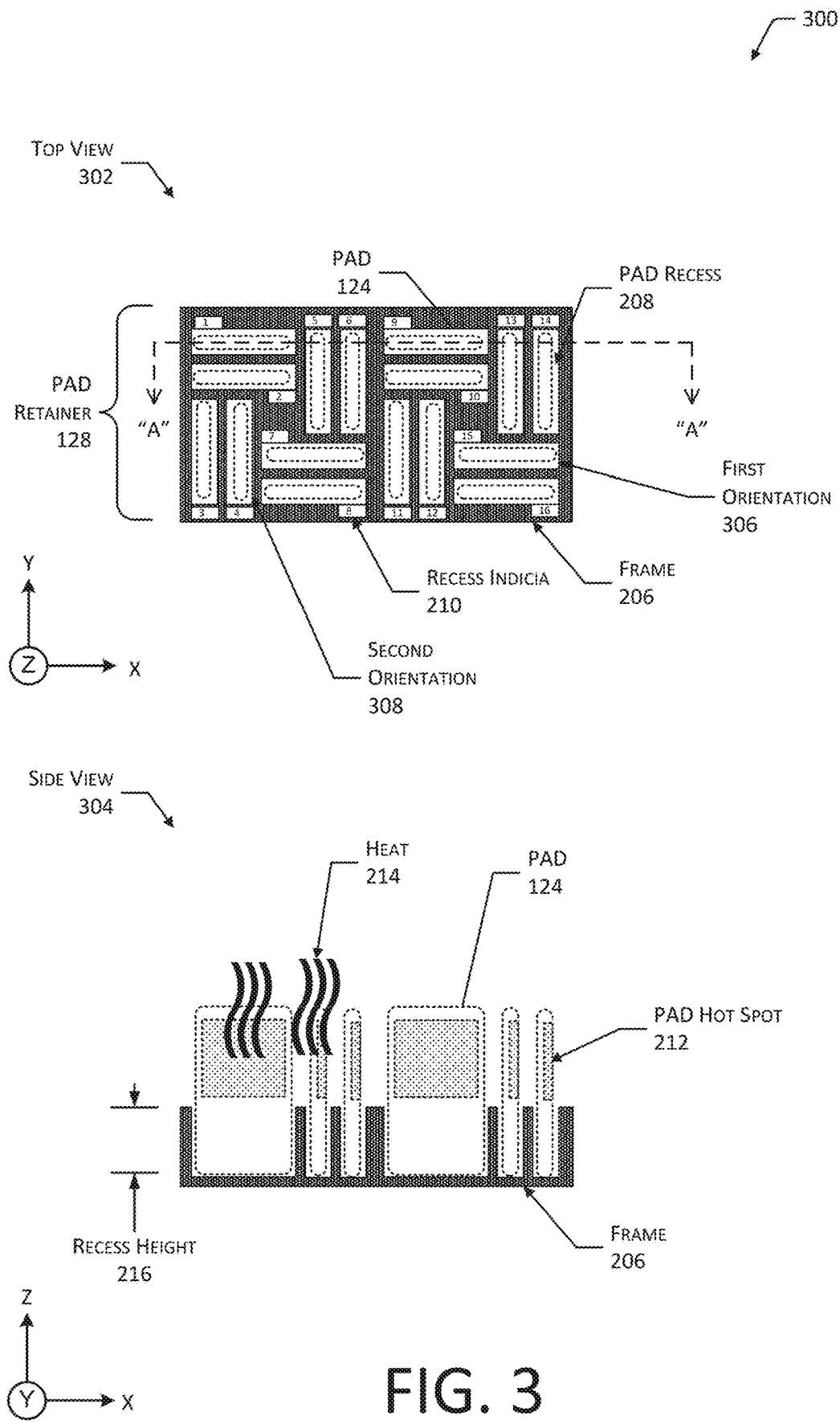
FIG. 3 depicts a second implementation of a PAD retainer.

FIG. 3 depicts a second implementation 300 of a PAD retainer 128. A top view 302 and a side view 304 along line A-A of the PAD retainer 128 are depicted.

In this illustration, the frame 206 provides a plurality of PAD recesses 208. Pairs of PAD recesses 208 are arranged in either a first orientation 306 or a second orientation 308. The first orientation 306 and the second orientation 308 are arranged generally perpendicular to one another. As described above, in some implementations, different PAD recesses 208 may have different recess heights 216.

While the pattern of PAD recesses 208 with respect to the frame 206 are arranged in pairs of PAD recesses 208, in other implementations, more or fewer PAD recesses 208 may be oriented in different arrangements. In other implementations, the angle between the first orientation 306 and the second orientation 308 may vary. For example, the PAD recesses 208 may be arranged in other regular tiling patterns, random arrangements, pseudorandom arrangements, and so forth. In addition to different recess heights 216, the PAD recesses 208 in the PAD retainer 128 may have different lengths or widths. Different sizes of PAD recesses 208 may be used to accommodate PADs 124 of different sizes. Information about the particular orientation of a particular PAD recess 208 on the PAD retainer 128 may be maintained. In some implementations, the developer 102 may select a particular orientation for use during testing.

In some implementations, the orientations of the PAD recesses 208 and the resulting orientation of the PAD 124 when stowed in the recess 208 may be used to obtain a particular polarization direction of emitted electromagnetic signal. For example, by having some PAD recesses 208 oriented in the first orientation 306, the antennas of an onboard radio may exhibit some degree of gain or favor a particular polarization with respect to a network access point 130 as compared to PAD recesses 208 oriented in the second orientation 308. As a result, the developer 102 may be able to perform tests using different polarizations to test operation under different electromagnetic propagation conditions.

As described above, the recess height 216 may be configured to allow heat 214 to be dissipated from the PAD hot spot 212 into the ambient environment.

Figure 4:
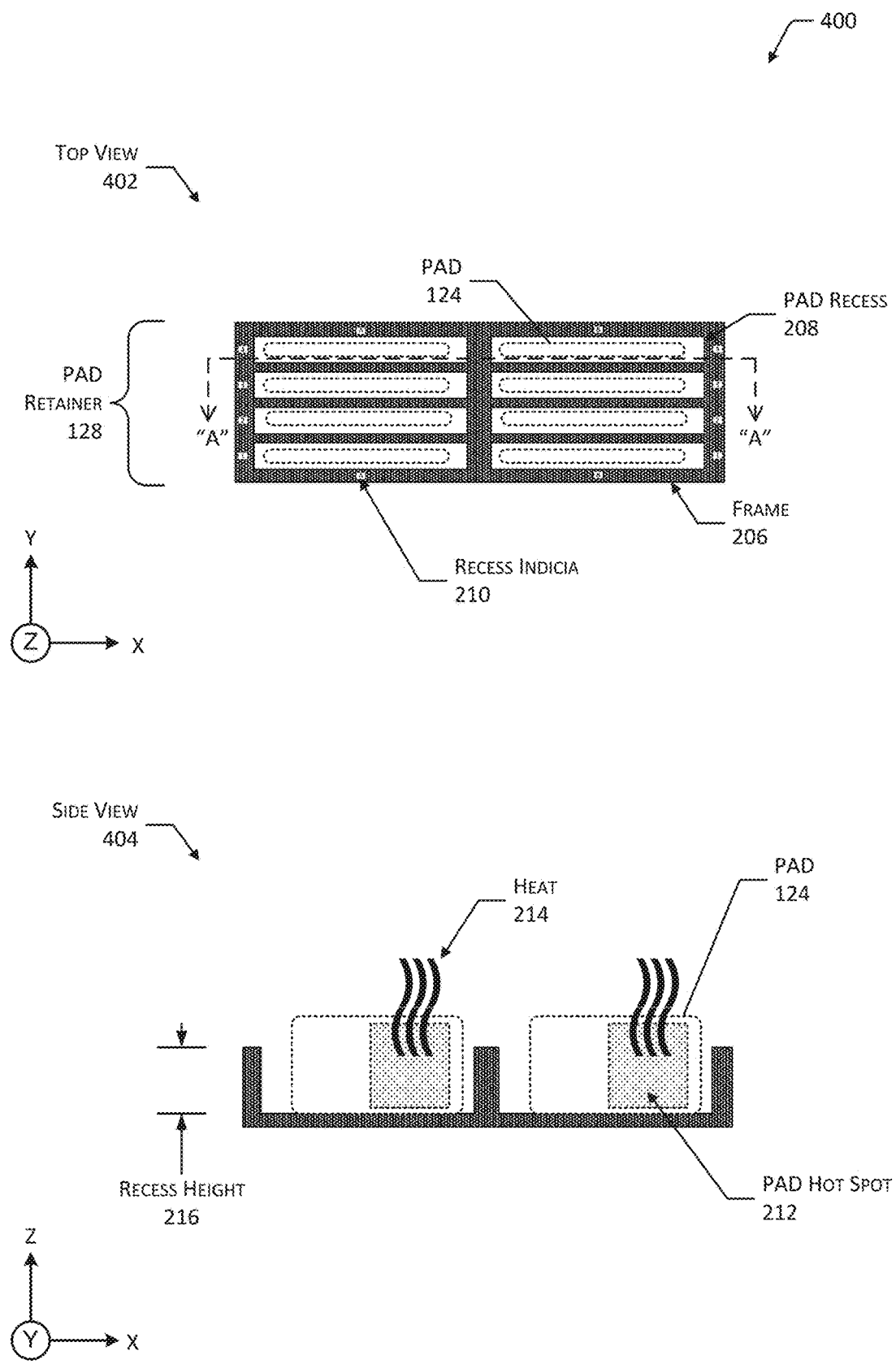
FIG. 4 depicts a third implementation of a PAD retainer.

FIG. 4 depicts a third implementation 400 of a PAD retainer 128. A top view 402 and a side view 404 along line A-A of the PAD retainer 128 are depicted.

In this illustration, the frame 206 provides a plurality of PAD recesses 208. The PAD recesses 208 are arranged such that a longest axis of the PAD recess 208 is parallel to a long axis of the PAD retainer 128. When stowed, the PADs 124 rest on what would typically be a left or a right side of the PAD 124 during typical use. As described above, the recess height 216 is configured such that at least a portion of the PAD hot spot 212 is exposed to the ambient environment, allowing dissipation of heat 214 to the ambient environment. In some implementations, the portion of the frame 206 that comprises the walls of the PAD recess 208 may be at least partially cut away to provide for improved circulation of air past the PAD hot spot 212.

In this configuration with the PADs 124 resting on their sides, the overall height of the PAD retainer 128 with the PADs 124 stowed therein is reduced. This configuration may be used in some implementations where a lower profile installation is desired.

As described above with regard to FIG. 3, different orientations such as those depicted in FIG. 4 may result in a different polarization of emitted electromagnetic signals from the PADs 124. Different orientations allow for testing under different conditions consistent with the different orientations of the PADs 124 that may be encountered during use.

Figure 5:
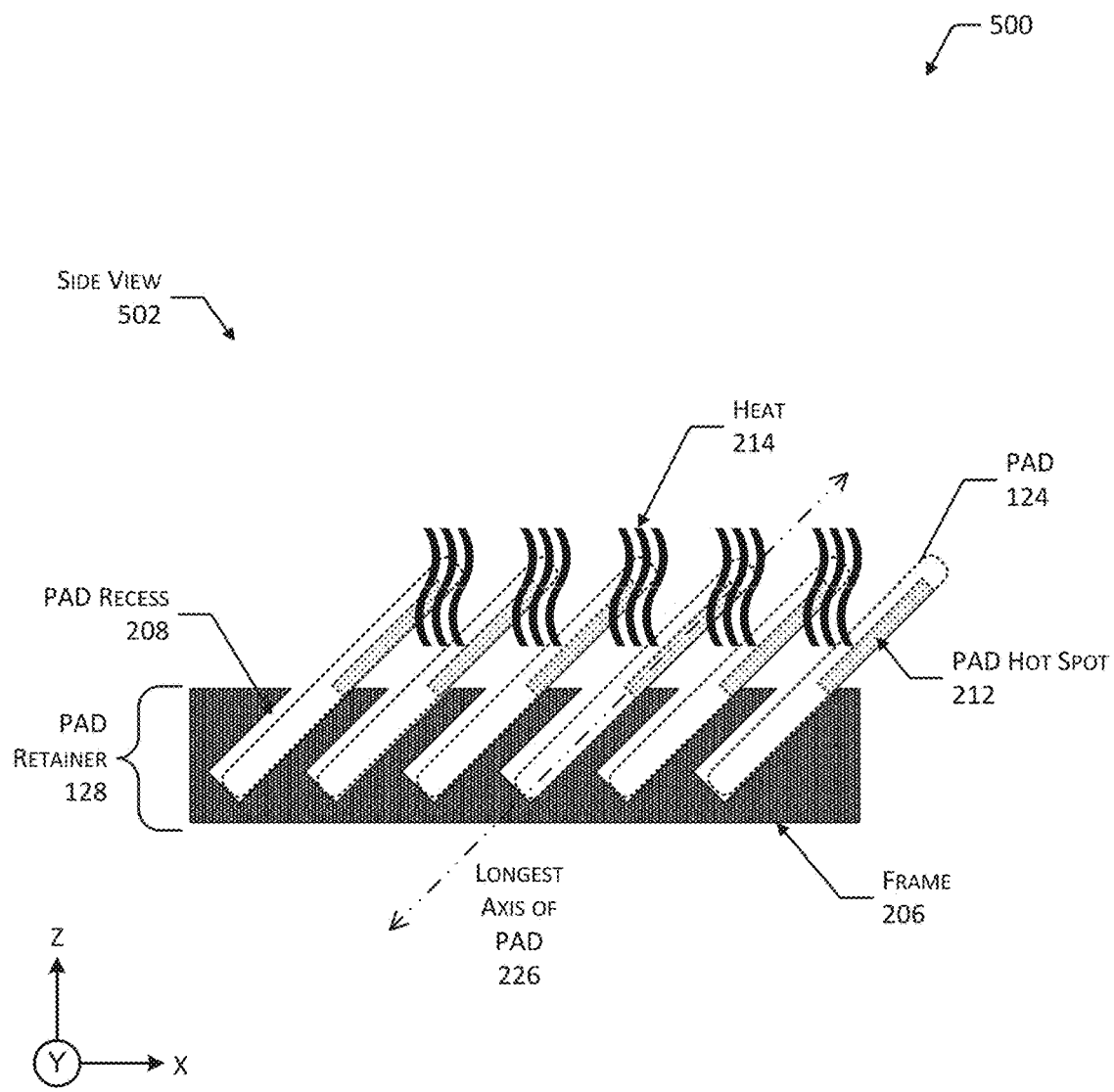
FIG. 5 depicts a fourth implementation of a PAD retainer.

FIG. 5 depicts a fourth implementation 500 of a PAD retainer 128. A side view 502 of the PAD retainer 128 is depicted. In this implementation, the longest axes of the PAD recesses 208 are at a particular angle relative to vertical (local down due to gravity). This angle is greater than zero but less than 90 degrees, relative to vertical. When stowed, the longest axis of the PADs 226 is also at the particular angle. At least a portion of the PAD hot spot 212 remains exposed to the ambient environment, allowing for dissipation of heat 214.

In this configuration with the PADs 124 at an angle relative to vertical, the overall height of the PAD retainer 128 with the PADs 124 stowed therein is reduced. This configuration may be used in some implementations where a lower profile installation is desired.

As described above with regard to FIG. 3, different orientations such as shown may result in a different polarization of emitted electromagnetic signals from the PADs 124. Different orientations allow for testing under different conditions consistent with the different orientations of the PADs 124 that may be encountered during use.

Figure 6:
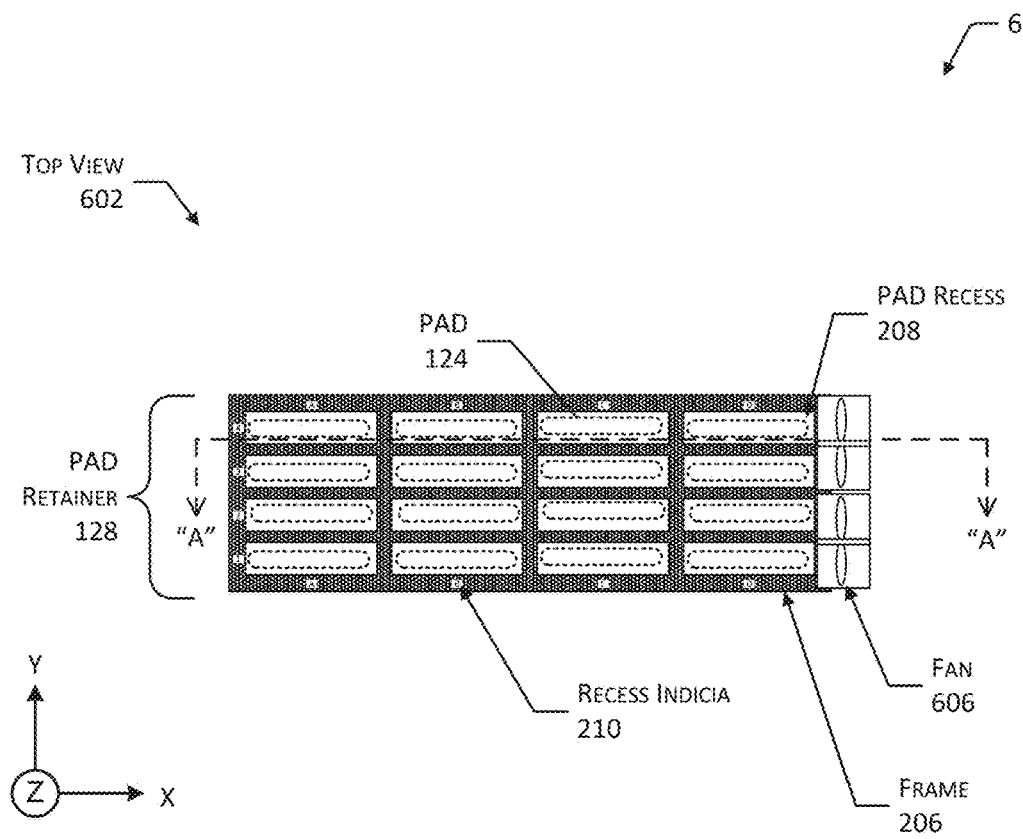
FIG. 6 depicts a fifth implementation of a PAD retainer.
Figure 6:
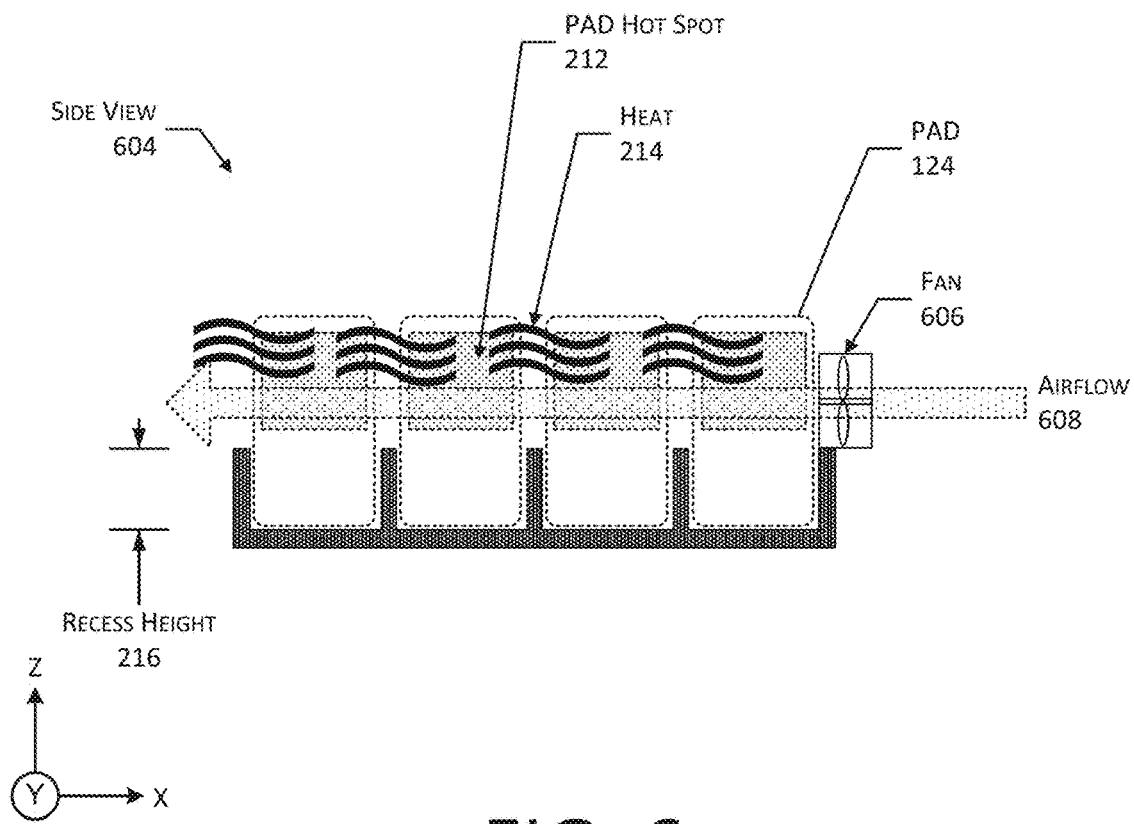

FIG. 6 depicts a fifth implementation 600 of a PAD retainer 128. A top view 602 and a side view 604 along line A-A of the PAD retainer 128 are depicted.

In this implementation, a fan 606 or other air moving device is employed to provide airflow 608 past the PAD recesses 208. The airflow 608 may increase the rate of heat transfer between the PAD hot spot 212 and the ambient air by maintaining an improved temperature differential between the ambient air in service of the PAD 124. For example, by actively moving the ambient air past the PADs 124 with a fan 606, warmer air is removed and cooler air is introduced more quickly.

An enclosure that surrounds at least a portion of the frame 206 may also be used. In one implementation, the sidewalls along the perimeter of the frame 206 may be greater in height than those of the interior portions, providing a channel through which the airflow 608 is directed along the length of the PAD retainer 128 and PAD recesses 208 therein.

As shown here, PAD recesses 208 may be oriented parallel to the direction of airflow 608. For example, the PAD recesses 208 may have a width greater than a length. An axis extending along the width of each PAD recess 208 is substantially parallel to the direction of the airflow 608 produced by the fan 606.

In some implementations, one or more features such as strakes may be arranged on the frame 206 or affixed to the enclosure. These features may be used to introduce turbulence into the airflow 608 to improve mixing of air and overall transfer of the heat 214 from the PADs 124 to the ambient air.

Figure 7:
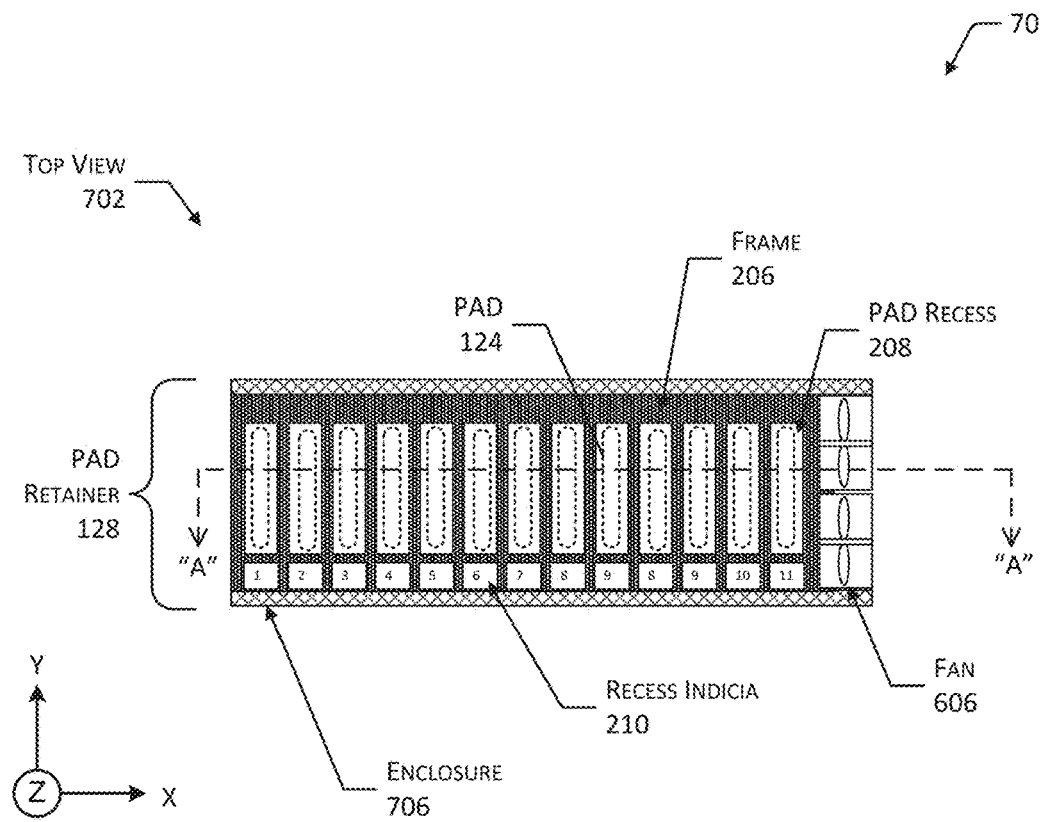
FIG. 7 depicts a sixth implementation of a PAD retainer.
Figure 7:
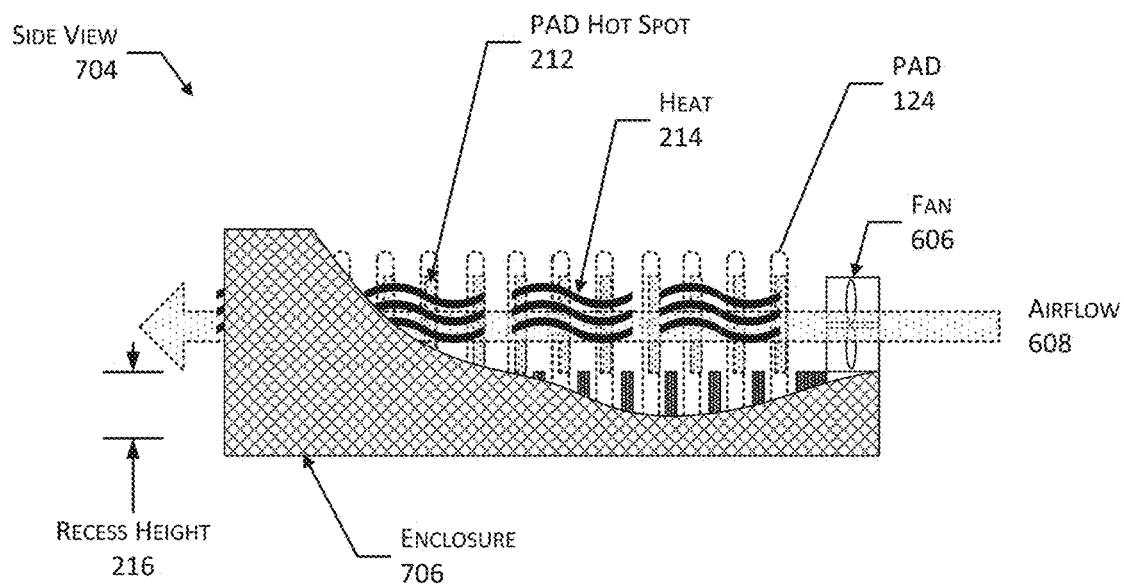

FIG. 7 depicts a sixth implementation 700 of a PAD retainer 128. A top view 702 and a side view 704 along line A-A of the PAD retainer 128 are depicted.

The frame 206 is depicted within an enclosure 706. The enclosure 706 may be partial, such as including only sidewalls, or may be complete such as extending around four or more sides of the frame 206. As described with respect to the other figures, those implementations may also utilize an enclosure 706. The enclosure 706 may be configured to be opened to allow for access to the PAD recesses 208 and the PADs 124 stowed therein. In some implementations, the frame 206 may slide out from the enclosure 706, such as a drawer.

As shown here, PAD recesses 208 may be oriented perpendicular to the direction airflow 608. For example, the PAD recesses 208 may have a width greater than a length. An axis extending along the width of each PAD recess 208 is substantially perpendicular to the direction of the airflow 608 produced by the fan 606.

Figure 8:
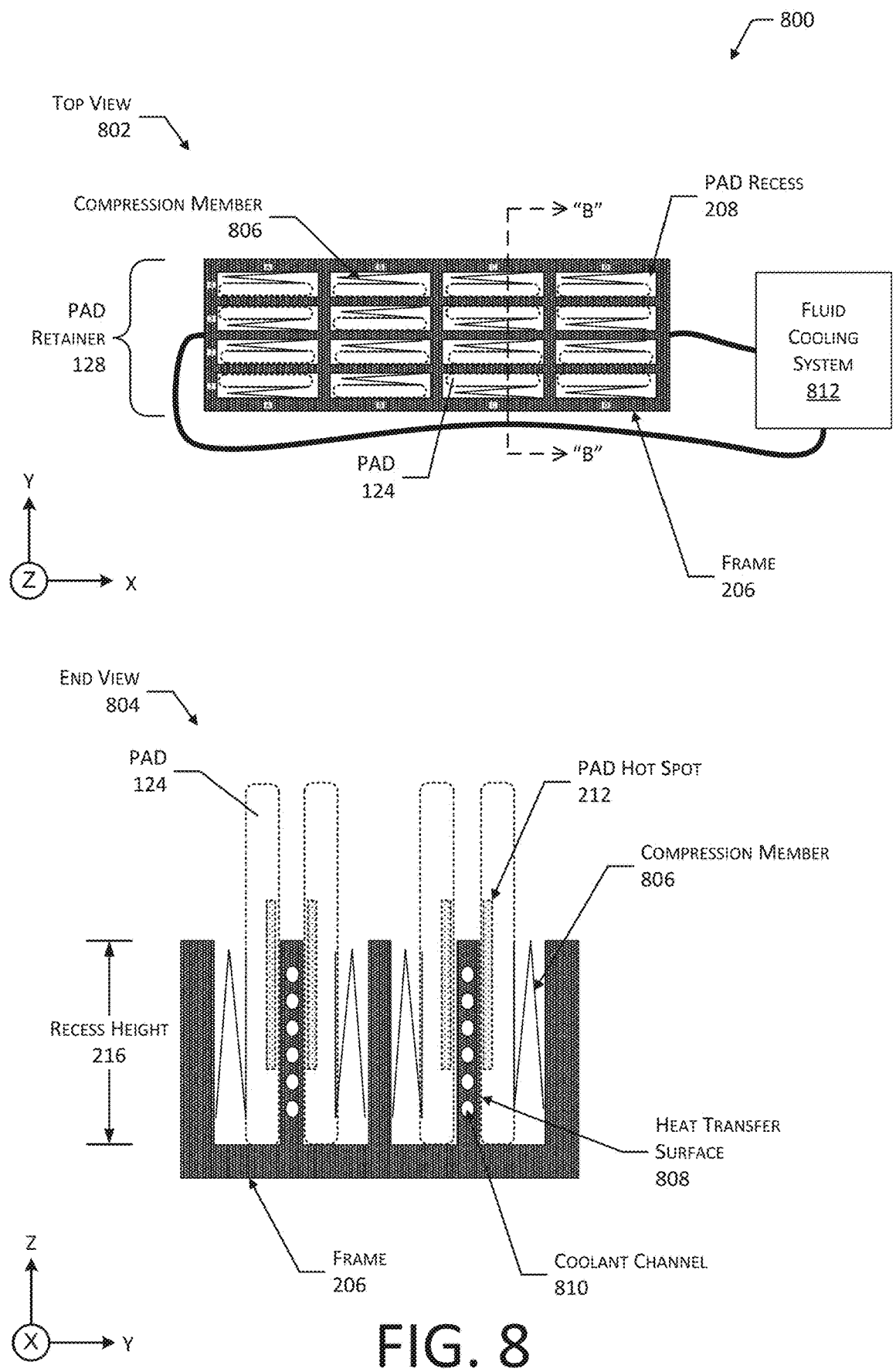
FIG. 8 depicts a seventh implementation of a PAD retainer.

FIG. 8 depicts a seventh implementation 800 of a PAD retainer 128. A top view 802 and an end view 804 along line B-B of the PAD retainer 128 are depicted.

As depicted, each of the PAD recesses 208 includes at least one compression member 806 configured to bias the PAD 124 in that recess 208 into contact with a heat transfer surface 808 within the PAD recess 208. The compression member 806 may comprise a spring, elastomeric material, angled surface, magnet, and so forth. For example, the compression member 806 may comprise a spring and a plate that are used to exert pressure to maintain contact between the PAD 124 when stowed in the pad recess 208 and the heat transfer surface 808.

By placing at least a portion of the surface of the PAD 124 in contact with the heat transfer surface 808, the heat 214 may be transferred from the PAD 124 to the heat transfer surface 808 instead of or in addition to the ambient atmosphere.

The heat transfer surfaces 808 may include one or more cooling elements. The cooling elements may include one or more of a thermoelectric cooling device, heat pipe, coolant channels with circulating coolant, and so forth. For example, as depicted here, a fluid cooling system 812 may pump a refrigerant such as air, water, or other material through coolant channels 810 located proximate to the heat transfer surface 808. Heat 214 may pass from the PAD hot spot 212 through the heat transfer surface 808 and into the refrigerant within the coolant channel 810. A fluid cooling system 812 may then exhaust the heat 214 either into the ambient atmosphere or into another thermal reservoir.

The use of the heat transfer surface 808 may be utilized in several scenarios. This technique may permit extremely high density environments in which a large number of PADs 124 are present within a relatively small volume. This technique may be used when the ambient cooling air in a POP facility 126 is insufficiently chilled to provide desired cooling of the PADs 124. This technique may also be used in situations where the PAD 124 is being operated at high levels of energy dissipation resulting in high levels of heat 214 that would otherwise exceed the devices' ability to be cooled using ambient air alone.

In some implementations, the heat transfer surface 808 may be configured to conform to at least a portion of the surface of the PAD 124. For example, the heat transfer surface 808 may include a thermally conductive insert that is designed to allow for conformal contact with the surface of the PAD 124. In another example, the heat transfer surface 808 may comprise a thermally conductive elastomeric or otherwise compressible material. Upon application of the biasing force from the compression member 806, the portion of the PAD 124 in contact with the heat transfer surface 808 may deform or compress the material of the heat transfer surface 808 to provide improved conductive heat transfer.

In some implementations, the frame 206 depicted in this figure may be within an enclosure 706. The enclosure 706 may be sealed to prevent the incursion of moisture. A desiccant or dehumidifier may be employed to reduce humidity within the enclosure 706 and prevent condensation of water on the heat transfer surfaces 808.

As described above, in some implementations, the recess height 216 may be configured to provide coverage by the heat transfer surface 808 of at least a portion of the PAD hot spot 212 of the PAD 124. For example, the recess height 216 of the PAD recess 208 may permit contact between the heat transfer surface 808 of the PAD recess 208 and a predetermined minimum surface area of the PAD 124 sufficient to transfer heat 214 from the PAD 124 at a minimum heat transfer rate.

Figure 9:
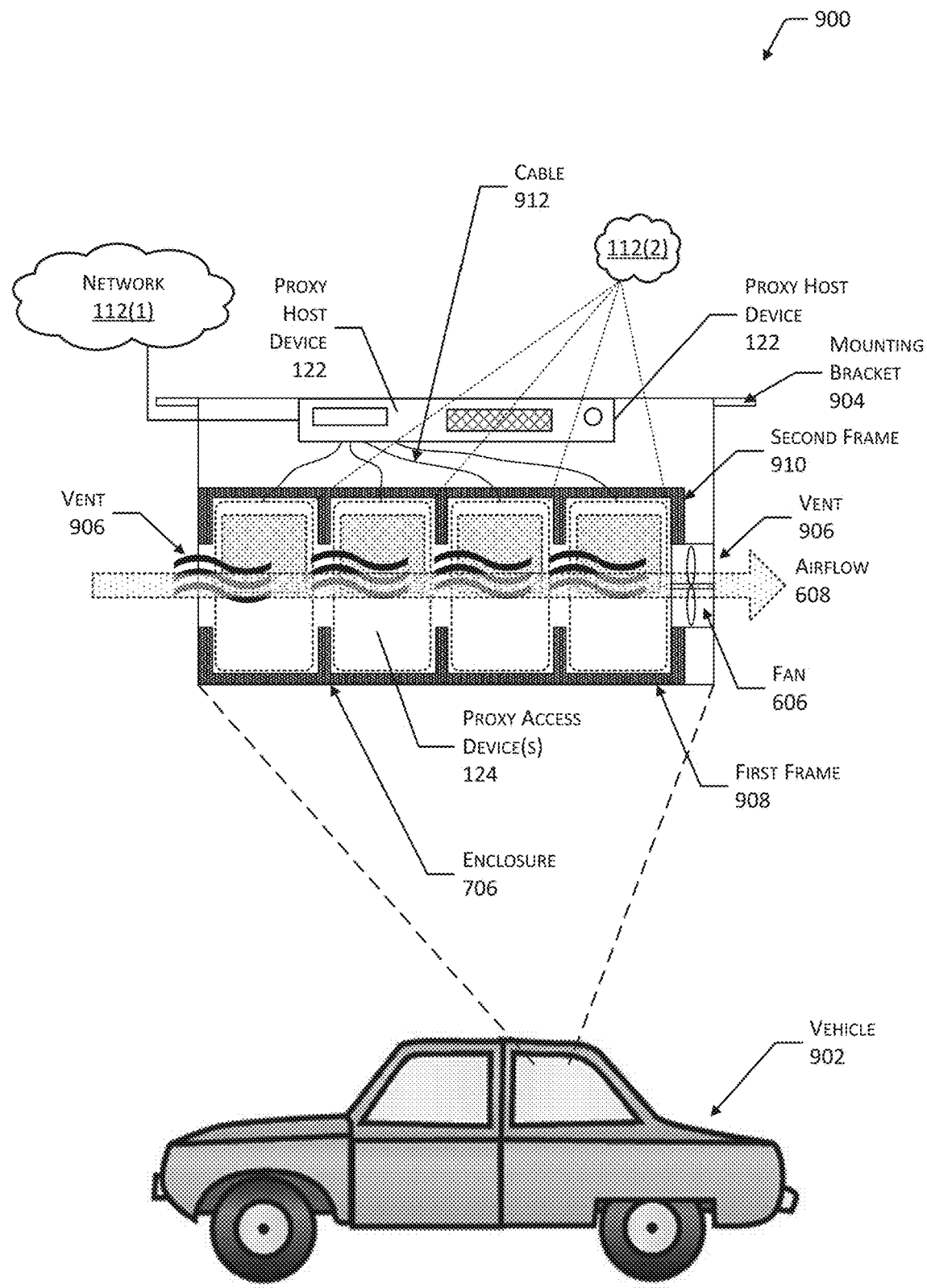
FIG. 9 depicts a mobile point-of-presence, according to one implementation.

FIG. 9 depicts a mobile POP 900, according to one implementation. In some implementations, it may be advantageous to provide testing in a mobile situation. One or more mobile POP facilities 126 may be located onboard a vehicle 902. For example, the vehicle 902 may include a private conveyance such as a personal automobile, a conveyance for hire such as a taxi or rideshare vehicle, bus, train, aircraft, boat, submarine, lighter than air craft, hovercraft, so forth. In another implementation the mobile POP 900 may be part of a portable device such as implemented in a form factor of a carrying case, a backpack, and so forth. For example, the mobile POP 900 may fit within a satchel or backpack to facilitate testing in pedestrian-only areas.

An enclosure 706 is mounted using one or more mounting brackets 904 or other mechanical engagement features to a portion of the vehicle 902.

In one implementation, the enclosure 706 may include one or more vents 906. One or more fans 606 may draw air in through one or more of the vents 906 to produce airflow 608 past the PADs 124 and other devices within the enclosure 706. For example, the airflow 608 may also provide cooling for the proxy host device 122. The fans 606 may be used to pressurize the enclosure 706 or produce a suction to produce the airflow 608.

In another implementation, the enclosure 706 may omit the vents 906 and may utilize one or more of the cooling elements to dissipate the heat 214 produced by the devices within the enclosure 706. As described above, cooling elements may include one or more of a thermoelectric cooling device, heat pipe, coolant channels with circulating coolant, and so forth.

Within the enclosure 706, or integral with the enclosure 706, is a first frame 908 and a second frame 910. The first frame 908 and the second frame 910 comprise one or more PAD recesses 208. The first frame 908 and the second frame 910 are mounted opposite one another such that the PADs 124 when stowed are restrained between the opposing PAD recesses 208. For example, as shown here, the first frame 908 has PAD recesses 208 that restrain a lower portion of the PADs 124 while the second frame 910 has PAD recesses 208 that restrain an upper portion of the PAD 124. When so restrained, the PADs 124 are protected within the enclosure 706 while the vehicle 902 may otherwise move about. In other implementations, other configurations of a frame 206 may be utilized. For example, a single piece frame 206 may be utilized into which the PADs 124 are inserted, and the first single piece frame 206 is subsequently placed into the enclosure 706. The walls of the enclosure 706 may serve to further confine the motion of the PADs 124 once inserted.

Within or proximate to the enclosure 706 is a proxy host device 122. The proxy host device 122 may include a network interface to communicate with an external network. For example, the proxy host device 122 may include a wired Ethernet local area network interface that is connected to a local network on board the vehicle 902. In another example, the proxy host device 122 may include a WCDN, WLAN, WWAN, or other network interface to provide connectivity to the network 112(1). In some implementations, one or more of the carrier, communication mode, and so forth, used by the proxy host device 122 to communicate to the network 112(1) may be selected to be different from that used by the PAD 124 during testing, to minimize contention for data transfer resources.

A cable 912 comprising a connector having a first end configured to couple to the PAD 124 and a second end coupled to the proxy host device 122 may be within the enclosure 706. For example, the cable 912 may comprise the tether that allows the proxy host device 122 to communicate with the PAD 124.

By utilizing the mobile POP facility 126 as depicted in FIG. 9, the developer 102 may generate information about the AUT 104 under the conditions of operation on board a moving vehicle 902 without ever having to leave their office. The developer 102 may thus be able to inexpensively and quickly test more frequently and across many different locations. As a result, the developer 102 may be better able to improve the operation of the AUT 104.

By utilizing the devices and techniques described in this disclosure, a high density system of many PADs 124 may be more easily deployed and maintained at POP facilities 126 in many geolocations 110.

The processes discussed in this disclosure may be implemented in hardware, software, or a combination thereof. In the context of software, the described operations represent computer-executable instructions stored on one or more computer-readable storage media that, when executed by one or more hardware processors, perform the recited operations. Generally, computer-executable instructions include routines, programs, objects, components, data structures, and the like that perform particular functions or implement particular abstract data types. Those having ordinary skill in the art will readily recognize that certain steps or operations illustrated in the figures above may be eliminated, combined, or performed in an alternate order. Any steps or operations may be performed serially or in parallel. Furthermore, the order in which the operations are described is not intended to be construed as a limitation.

Embodiments may be provided as a software program or computer program product including a non-transitory computer-readable storage medium having stored thereon instructions (in compressed or uncompressed form) that may be used to program a computer (or other electronic device) to perform processes or methods described in this disclosure. The computer-readable storage medium may be one or more of an electronic storage medium, a magnetic storage medium, an optical storage medium, a quantum storage medium, and so forth. For example, the computer-readable storage media may include, but is not limited to, hard drives, floppy diskettes, optical disks, read-only memories (ROMs), random access memories (RAMs), erasable programmable ROMs (EPROMs), electrically erasable programmable ROMs (EEPROMs), flash memory, magnetic or optical cards, solid-state memory devices, or other types of physical media suitable for storing electronic instructions. Further, embodiments may also be provided as a computer program product including a transitory machine-readable signal (in compressed or uncompressed form). Examples of transitory machine-readable signals, whether modulated using a carrier or unmodulated, include, but are not limited to, signals that a computer system or machine hosting or running a computer program can be configured to access, including signals transferred by one or more networks. For example, the transitory machine-readable signal may comprise transmission of software by the Internet.

Separate instances of these programs can be executed on or distributed across any number of separate computer systems. Although certain steps have been described as being performed by certain devices, software programs, processes, or entities, this need not be the case, and a variety of alternative implementations will be understood by those having ordinary skill in the art.

Additionally, those having ordinary skill in the art will readily recognize that the techniques described above can be utilized in a variety of devices, environments, and situations. Although the subject matter has been described in language specific to structural features or methodological acts, it is to be understood that the subject matter defined in the appended claims is not necessarily limited to the specific features or acts described. Rather, the specific features and acts are disclosed as exemplary forms of implementing the claims.

What is claimed is:

1. A system comprising:
a frame comprising a plurality of recesses, each recess of the plurality of recesses having at least one sensor, wherein a first sensor is arranged to capture first data indicative of an image presented on at least a portion of a display of a proxy access device positioned within the recess, the proxy access device comprising a computing device, wherein:
   each recess has a width and length to accept a first end of the proxy access device; and
   a recess height of each recess is less than or equal to a distance from the first end to a first edge of an area on the proxy access device at which heat is radiated by the proxy access device during operation, such that at least a portion of the area is exposed to ambient air during operation; and
   one or more machine-readable recess indicia to identify individual ones of the plurality of recesses within the frame.

2. The system of claim 1, the frame further comprising a base and a plurality of walls, wherein at least one of the plurality of walls comprises a material substantially transparent to radio frequencies associated with operation of one or more radios within the proxy access device, and further wherein the material of the frame comprises one or more of a plastic, ceramic, wood, paper, glass, or composite material.

3. The system of claim 1, further wherein the recess is configured to hold the proxy access device upside down with a longest axis of the proxy access device oriented at an angle less than 70 degrees from vertical.

4. The system of claim 1, further comprising one or more human-readable recess indicia configured to identify individual ones of the plurality of recesses within the frame.

5. The system of claim 1, wherein the at least one sensor comprises one or more of:
a thermocouple,
a photosensor,
a camera,
a near field communication device,
a radio frequency identification device,
an accelerometer, or
a proximity sensor; and
the system further comprising:
a communication interface; and
a data processing device including at least one processor executing instructions to generate data based at least in part on output from the at least one sensor.

6. The system of claim 1, further comprising:
a connector at the recess, the connector having a first end configured to couple to the proxy access device and a second end coupled to a communication interface; and
wherein, when the proxy access device is coupled to the connector, the communication interface establishes communication between the proxy access device and an external device.

7. The system of claim 1, wherein a first recess is arranged in a first orientation with respect to the frame and further wherein a second recess is arranged in a second orientation that is different from the first orientation with respect to the frame.

8. The system of claim 1, further comprising:
a fan to direct air past each of the plurality of recesses.

9. A system comprising:
a first frame comprising a first recess and a second recess, wherein:
   the first recess is sized to accept a first end of a first proxy access device;
   the first recess has a first recess height that exposes at least a portion of the first proxy access device, including a first area on the first proxy access device at which heat is radiated by the first proxy access device during operation, such that the first area is exposed to ambient air circulation during operation;
   the second recess is sized to accept a first end of a second proxy access device; and
   the second recess has a second recess height that exposes at least a portion of the second proxy access device, including a second area on the second proxy access device at which heat is radiated by the second proxy access device during operation, such that the second area is exposed to ambient air circulation during operation;
at least one sensor, wherein a first sensor is arranged to determine first data indicative of video presented on at least a portion of a display of the first proxy access device; and
one or more machine-readable recess indicia configured to identify the first recess and the second recess.

10. The system of claim 9, wherein the at least a portion of the first proxy access device exposed to the ambient air circulation comprises a heat sink within the first proxy access device.

11. The system of claim 9, further comprising a fan to direct air past the first recess and the second recess during operation.

12. The system of claim 11, wherein each of the first recess and the second recess has a width greater than a length, and further wherein an axis extending along the width of each of the first recess and the second recess is substantially parallel to a direction of the air from the fan.

13. The system of claim 9, wherein at least a portion of the first frame comprises one or more materials substantially transparent to radio frequencies.

14. The system of claim 9, wherein at least a portion of the first frame comprises an electrically conductive material with an opening to pass radio signals used by the first proxy access device during operation.

15. The system of claim 9, further comprising:
an enclosure including one or more cooling vents;
a fan, when operating, to direct air past the first recess and the second recess;
a computing device including a network interface to communicate with an external network;
a first cable comprising a connector having a first end to couple to the first proxy access device and having a second end coupled to the computing device; and
a second frame comprising a first recess and a second recess and positioned above the first frame, wherein:

the first recess of the second frame operates with the first recess of the first frame to restrain the first proxy access device; and the second recess of the second frame operates with the second recess of the first frame to restrain the second proxy access device.

16. The system of claim 9, further comprising:

a second frame comprising a first recess of the second frame and a second recess of the second frame, the second frame positioned opposite the first frame, wherein:

the first recess of the second frame and the first recess of the first frame restrain the first proxy access device; and the second recess of the second frame and the second recess of the first frame restrain the second proxy access device.

17. A system comprising:

a frame comprising a base and walls defining at least one recess, wherein the at least one recess includes:

an opening sized to accept an end of a proxy access device; and a recess depth that is less than or equal to a distance from a first end to a first edge of an area that radiates heat during operation, such that the area is exposed to ambient air circulation during operation;

a plurality of sensors including a first sensor associated with the at least one recess, the first sensor arranged to detect a parameter of the proxy access device during operation of the proxy access device and generate sensor data indicative of operation of the proxy access device based on the parameter; and one or more machine-readable recess indicia configured to identify the at least one recess.

18. The system of claim 17, wherein at least a portion of the frame comprises an electrically conductive material with an opening to pass radio signals used by the proxy access device during operation.

19. The system of claim 17, wherein a first recess is arranged in a first orientation with respect to the frame and further wherein a second recess is arranged in a second orientation that is different from the first orientation with respect to the frame.

* * * * *